(12) United States Patent
Nishi et al.

(10) Patent No.: US 11,799,023 B2
(45) Date of Patent: Oct. 24, 2023

(54) SEMICONDUCTOR DEVICE

(71) Applicant: Mitsubishi Electric Corporation, Tokyo (JP)

(72) Inventors: Koichi Nishi, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 254 days.

(21) Appl. No.: 17/406,003

(22) Filed: Aug. 18, 2021

(65) Prior Publication Data

US 2022/0293777 A1 Sep. 15, 2022

(30) Foreign Application Priority Data

Mar. 15, 2021 (JP) ................. 2021-041715

(51) Int. Cl.
*H01L 29/739* (2006.01)
*H01L 29/06* (2006.01)

(52) U.S. Cl.
CPC ...... *H01L 29/7397* (2013.01); *H01L 29/0696* (2013.01)

(58) Field of Classification Search
CPC ................. H01L 29/7397; H01L 29/0696
USPC ...................................... 257/139
See application file for complete search history.

(56) References Cited

U.S. PATENT DOCUMENTS

2014/0048844 A1   2/2014  Song et al.
2023/0163122 A1*  5/2023  Soneda ............... H01L 27/0664
                                                          257/140

FOREIGN PATENT DOCUMENTS

JP          2015-188104 A      10/2015

\* cited by examiner

*Primary Examiner* — Igwe U Anya
(74) *Attorney, Agent, or Firm* — Studebaker & Brackett PC (57) ABSTRACT

A semiconductor device includes: a semiconductor substrate including an upper surface and a lower surface opposing each other and a drift layer of a first conductivity type; a base layer of a second conductivity type; an emitter layer of the first conductivity type and a contact layer of the second conductivity type; an active trench; dummy trenches; a trench gate electrode formed in the active trench; a dummy trench gate electrode formed in each of the dummy trenches; an embedded insulating film formed on the trench gate electrode in the active trench, formed on the dummy trench gate electrode in the dummy trench, and having an upper end lower than the upper surface; and an emitter electrode contacting the emitter layer on the upper surface and an inner wall of the active trench, and contacting the contact layer on the upper surface and an inner wall of the dummy trench.

15 Claims, 6 Drawing Sheets

SEMICONDUCTOR DEVICE

BACKGROUND OF THE INVENTION

Field

The present disclosure relates to a semiconductor device.

Background

From the viewpoint of energy saving, an IGBT and a diode have been used for a power module or the like for performing various speed control of a three-phase motor in a field of a general-purpose inverter/AC servo, for example. To reduce an inverter loss, a device with a low switching loss and a low on-voltage has been required as the IGBT and the diode.

Examples of the device with a low switching loss include a trench gate type IGBT. In the trench gate type IGBT, an IE effect is enhanced by narrowing the width of a mesa sandwiched between trench gates so that the on-voltage can be reduced. However, the narrower the width of the mesa is made, the narrower the width of a contact hole for connecting an emitter electrode to an emitter layer and a contact layer becomes. Therefore, microfabrication is required, whereby the mesa cannot be easily miniaturized. On the other hand, a structure in which an embedded insulating film is formed on a trench gate electrode in a trench has been proposed (see, e.g., Japanese Patent Laid-Open No. 2015-188104). As a result, the emitter electrode can be connected to the emitter layer and the contact layer without an interlayer insulating film and the contact hole being formed. Accordingly, the mesa is easily miniaturized.

SUMMARY

However, the deeper an upper end of the trench gate electrode becomes, the deeper the emitter layer is required to be made. Accordingly, the length in an up-down direction of a base layer decreases. A hole current flowing from a collector flows through a base layer in a transverse direction at the time of turn-off. Accordingly, when the length of the base layer is small, a resistance of a hole current path increases, and a potential of the base layer increases. As a result, an NPN transistor constituted by an emitter layer, a base layer, and a drift layer operates, and a parasitic thyristor constituted by an emitter layer, a base layer, a drift layer, and a collector layer is latched up, resulting in device destruction. Accordingly, there has been a problem that a latch-up tolerance deteriorates.

The present disclosure has been made to solve the above-described problem, and is directed to obtaining a semiconductor device that makes it easy to miniaturize a mesa and has a high latch-up tolerance.

A semiconductor device according to the present disclosure includes: a semiconductor substrate including an upper surface and a lower surface opposing each other and a drift layer of a first conductivity type formed between the upper surface and the lower surface; a base layer of a second conductivity type formed between the drift layer and the upper surface; an emitter layer of the first conductivity type and a contact layer of the second conductivity type which are formed between the base layer and the upper surface; an active trench penetrating the emitter layer and the base layer from the upper surface; dummy trenches sandwiching the active trench and penetrating the contact layer and the base layer from the upper surface; a trench gate electrode formed in the active trench with a gate insulating film interposed therebetween; a dummy trench gate electrode formed in each of the dummy trenches with a gate insulating film interposed therebetween; an embedded insulating film formed on the trench gate electrode in the active trench, formed on the dummy trench gate electrode in the dummy trench, and having an upper end lower than the upper surface; and an emitter electrode contacting the emitter layer on the upper surface and an inner wall of the active trench, and contacting the contact layer on the upper surface and an inner wall of the dummy trench.

In the present disclosure, the embedded insulating film is formed on the trench gate electrode in the active trench. As a result, the emitter electrode can be connected to the emitter layer and the contact layer without an interlayer insulating film and a contact hole being formed. Accordingly, a mesa is easily miniaturized. The contact layer not only contacts the emitter electrode on the upper surface of the semiconductor substrate but also contacts the emitter electrode on the inner wall of the dummy trench. Therefore, holes are discharged into the emitter electrode from not only the upper surface of the semiconductor substrate but also the inner wall of the dummy trench at the time of turn-off. Accordingly, holes are easily discharged so that a latch-up tolerance increases.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
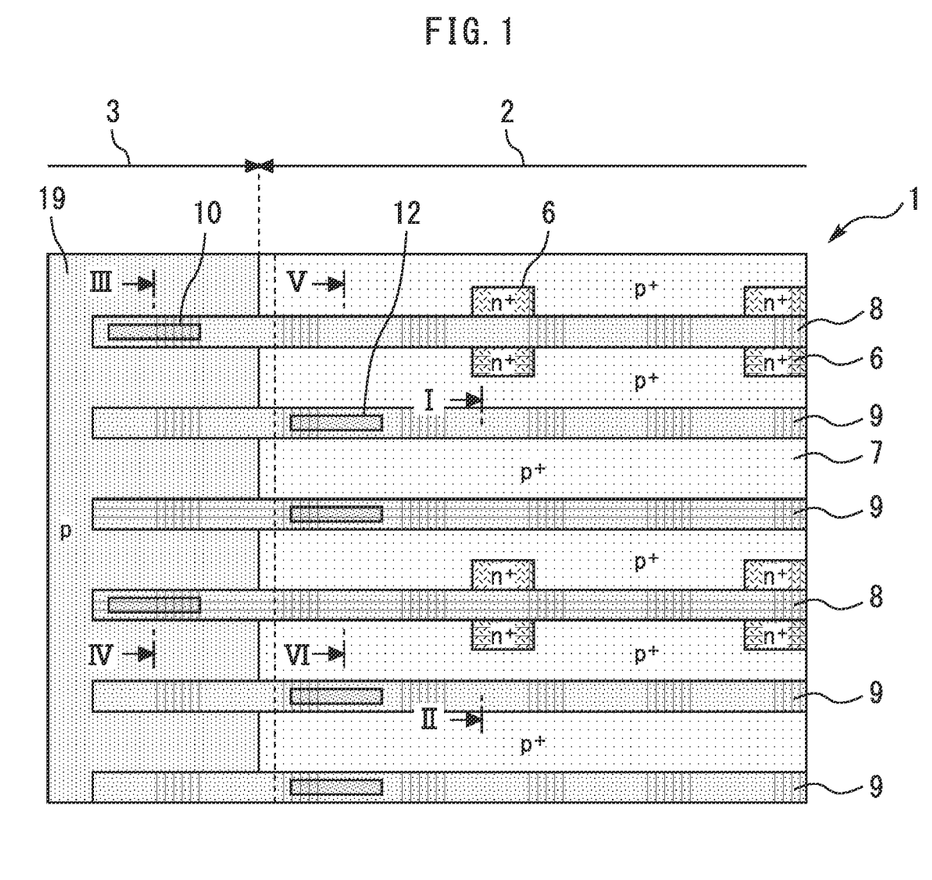
FIG. 1 is a plan view illustrating a semiconductor device according to a first embodiment.

FIG. 1 is a plan view illustrating a semiconductor device according to a first embodiment. A semiconductor substrate 1 includes an active region 2 and a wiring region 3 in a planar view. In FIG. 1, an electrode and an interlayer insulating film, for example, on the substrate are omitted.

Figure 2:
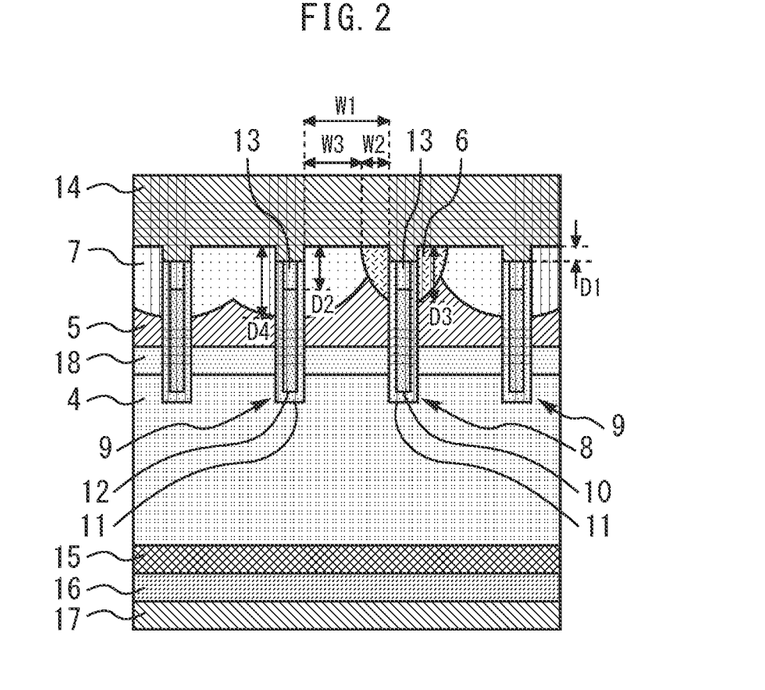
FIG. 2 is a cross-sectional view taken along a line I-II illustrated in FIG. 1.

FIG. 2 is a cross-sectional view taken along a line I-II illustrated in FIG. 1. The semiconductor substrate 1 includes an upper surface and a lower surface as main surfaces opposing each other and a drift layer 4 of a first conductivity type formed between the upper surface and the lower surface. A base layer 5 of a second conductivity type is formed between the drift layer 4 and the upper surface of the semiconductor substrate 1. For example, the first conductivity type is an n type, and the second conductivity type is a p type. An emitter layer 6 of the first conductivity type and a contact layer 7 of the second conductivity type are formed between the base layer 5 and the upper surface of the semiconductor substrate 1.

Active trenches 8 penetrate the emitter layer 6 and the base layer 5 from the upper surface of the semiconductor substrate 1, to reach the drift layer 4. Therefore, the emitter layer 6 is formed on both sides of each of the active trenches 8. Dummy trenches 9 penetrate the contact layer 7 and the base layer 5 from the upper surface of the semiconductor substrate 1, to reach the drift layer 4. Therefore, the contact layer 7 is formed on both sides of each of the dummy trenches 9.

The active trenches 8 and the dummy trenches 9 are arranged parallel to one another in a planar view. The one active trench 8 is sandwiched between the two dummy trenches 9. Therefore, the two active trenches 8 are not adjacent to each other. Accordingly, the emitter layer 6 does not contact the two active trenches 8.

A trench gate electrode 10 is formed in each of the active trenches 8 with a gate insulating film 11 interposed therebetween. A dummy trench gate electrode 12 is formed in each of the dummy trenches 9 with a gate insulating film 11 interposed therebetween. An embedded insulating film 13 is formed on the trench gate electrode 10 in the active trench 8, and is formed on the dummy trench gate electrode 12 in the dummy trench 9.

With reference to the upper surface of the semiconductor substrate 1, letting D1 be a depth to an upper end of the embedded insulating film 13, D2 be a depth to respective upper ends of the trench gate electrode 10 and the dummy trench gate electrode 12, D3 be a depth to a lower end of the emitter layer 6, and D4 be a depth to a lower end of the contact layer 7, 0<D1<D2<D3<D4. Since the upper end of the embedded insulating film 13 is lower than the upper surface of the semiconductor substrate 1 (0<D1), the contact layer 7 also contacts an emitter electrode 14 on an inner wall of the dummy trench 9.

The emitter electrode 14 contacts the emitter layer 6 on the upper surface of the semiconductor substrate 1 and an inner wall of the active trench 8, and contacts the contact layer 7 on the upper surface of the semiconductor substrate 1 and an inner wall of the dummy trench 9. A buffer layer 15 of the first conductivity type is formed under the drift layer 4. A collector layer 16 of the second conductivity type is formed under the buffer layer 15. A collector electrode 17 is connected to the collector layer 16.

As described above, in the present embodiment, the embedded insulating film 13 is formed on the trench gate electrode 10 in the active trench 8. As a result, the emitter electrode 14 can be connected to the emitter layer 6 and the contact layer 7 without an interlayer insulating film and a contact hole being formed. Accordingly, a mesa is easily miniaturized.

The contact layer 7 not only contacts the emitter electrode 14 on the upper surface of the semiconductor substrate 1 but also contacts the emitter electrode 14 on the inner wall of the dummy trench 9. Therefore, holes are discharged into the emitter electrode 14 from not only the upper surface of the semiconductor substrate 1 but also the inner wall of the dummy trench 9 at the time of turn-off. Accordingly, holes are easily discharged so that a latch-up tolerance increases.

The lower end of the contact layer 7 is lower than the lower end of the emitter layer 6 (D3<D4). Accordingly, holes are easily discharged into the contact layer 7 at the time of turn-off so that a latch-up tolerance increases.

A region between the active trench 8 and the dummy trench 9 adjacent to each other is referred to as an active mesa. Letting W1 be the width of the active mesa, W2 be the width of the emitter layer 6 exposed to the upper surface of the semiconductor substrate 1, and W3 be the width of the contact layer 7 exposed to the upper surface of the semiconductor substrate 1, W1=W2+W3. In the active mesa, the width W3 of the contact layer 7 exposed to the upper surface is larger than the width W2 of the emitter layer 6 exposed to the upper surface (W3>W2). As a result, a cross-sectional area of the contact layer 7 is made larger than that of the emitter layer 6, to widen a hole discharge path. As a result, a latch-up tolerance increases.

A carrier storage layer 18 of the first conductivity type is formed between the drift layer 4 and the base layer 5. The impurity concentration of the carrier storage layer 18 is higher than that of the drift layer 4. Injection of electrons increases by the carrier storage layer 18, and a carrier density in the drift layer 4 increases. Accordingly, an on-voltage is reduced.

The width of the emitter layer 6 narrows toward the lower surface of the semiconductor substrate 1 from the upper surface thereof. As a result, the hole discharge path is widened so that a latch-up tolerance can be improved.

Figure 3:
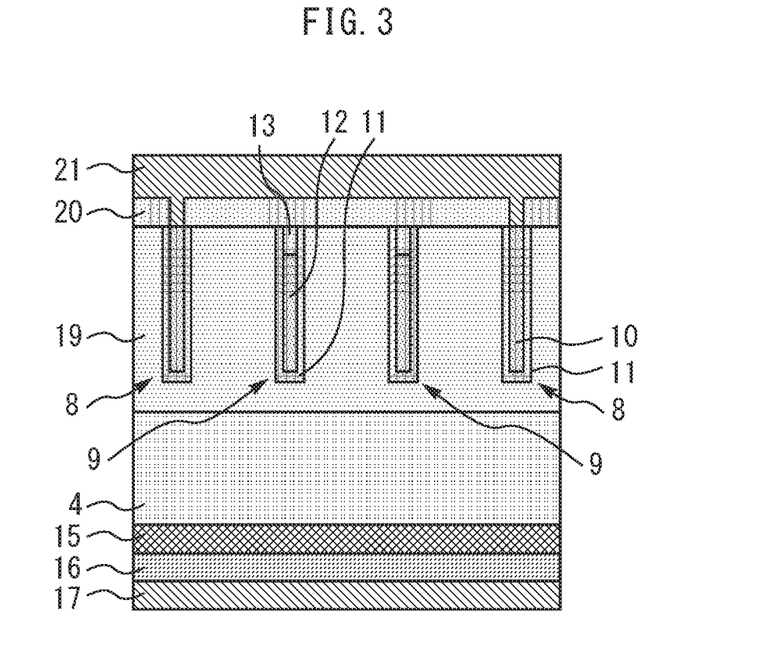
FIG. 3 is a cross-sectional view taken along a line III-IV illustrated in FIG. 1.

FIG. 3 is a cross-sectional view taken along a line III-IV illustrated in FIG. 1. In the wiring region 3, a well layer 19 of the second conductivity type is formed between the drift layer 4 and the upper surface of the semiconductor substrate 1. A gate electrode 21 is formed on the upper surface of the semiconductor substrate 1 with an interlayer insulating film 20 interposed therebetween. The embedded insulating film 13 is not formed in each of the active trenches 8, and an upper end of the trench gate electrode 10 is exposed to the upper surface of the semiconductor substrate 1. The trench gate electrode 10 is connected to the gate electrode 21 via an opening of the interlayer insulating film 20. As a result, the trench gate electrode 10 and the gate electrode 21 can be connected to each other without the gate electrode 21 being embedded into the active trench 8.

Figure 4:
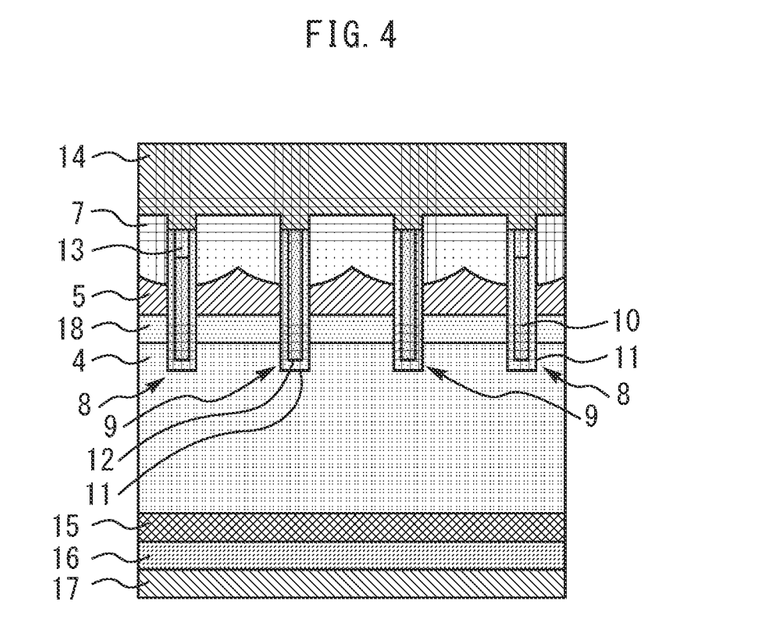
FIG. 4 is a cross-sectional view taken along a line V-VI illustrated in FIG. 1.

FIG. 4 is a cross-sectional view taken along a line V-VI illustrated in FIG. 1. In a part of the active region 2, the embedded insulating film 13 is not formed in each of the dummy trenches 9, and the upper end of the dummy trench gate electrode 12 is exposed to the upper surface of the semiconductor substrate 1 and is connected to the emitter electrode 14. As a result, the dummy trench gate electrode 12 and the emitter electrode 14 can be connected to each other without the emitter electrode 14 being embedded deep into the dummy trench 9.

The emitter electrode 14 is composed of a metal such as Al or AlSi. A barrier metal may be formed between the emitter electrode 14 and the emitter layer 6 and between the emitter electrode 14 and the contact layer 7. The barrier metal is composed of Ti, TiN, or TiSi, for example. A plug composed of W or the like may be formed.

Second Embodiment

Figure 5:
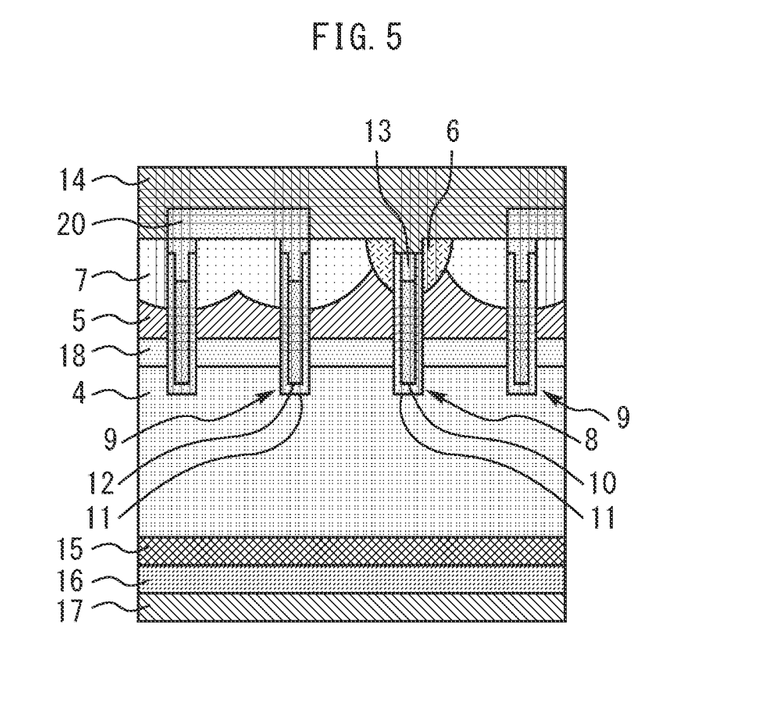
FIG. 5 is a cross-sectional view illustrating a semiconductor device according to a second embodiment.

FIG. 5 is a cross-sectional view illustrating a semiconductor device according to a second embodiment. A region between dummy trenches 9 adjacent to each other without an active trench 8 being sandwiched therebetween is referred to as a dummy mesa. In the present embodiment, in the dummy mesa, an interlayer insulating film 20 is formed between an upper surface of a semiconductor substrate 1 and an emitter electrode 14 so that the semiconductor substrate 1 and the emitter electrode 14 are insulated from each other. As a result, holes can be prevented from coming off an upper part of the dummy mesa, and a carrier density in a drift layer 4 increases. Accordingly, an on-voltage is reduced.

Third Embodiment

Figure 6:
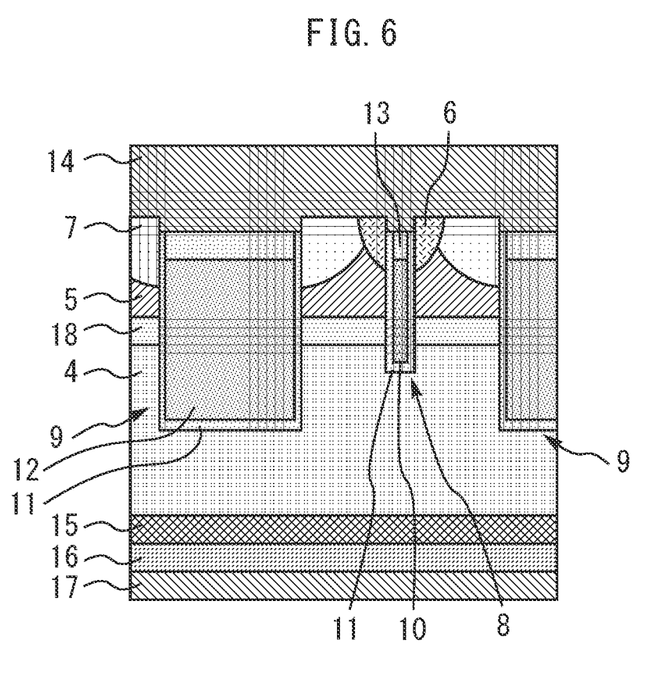
FIG. 6 is a cross-sectional view illustrating a semiconductor device according to a third embodiment.

FIG. 6 is a cross-sectional view illustrating a semiconductor device according to a third embodiment. In the present embodiment, the width of a dummy trench 9 is larger than the width of an active trench 8. Accordingly, the width of a dummy mesa decreases. The depth of the dummy trench 9 is larger than the depth of the active trench 8. As a result, holes can be prevented from coming off an upper part of the dummy mesa, and a carrier density in a drift layer 4 increases. Accordingly, an on-voltage is reduced.

Fourth Embodiment

Figure 7:
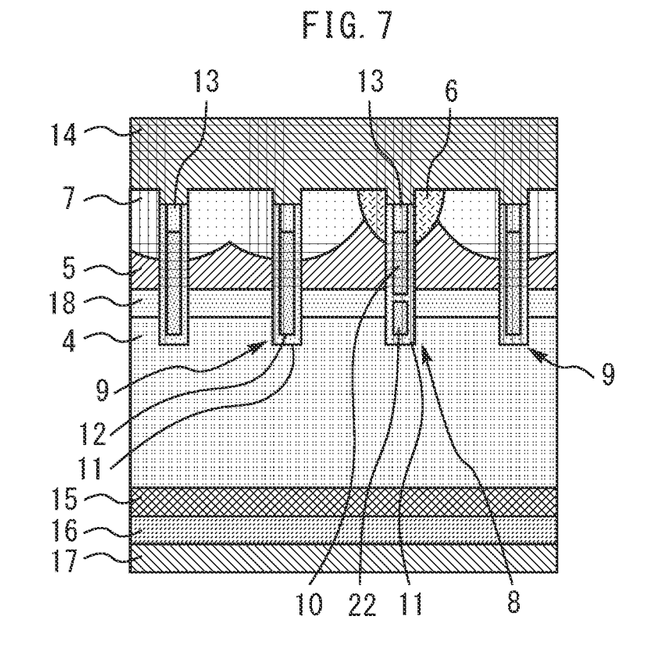
FIG. 7 is a cross-sectional view illustrating a semiconductor device according to a fourth embodiment.

FIG. 7 is a cross-sectional view illustrating a semiconductor device according to a fourth embodiment. In the present embodiment, a shield electrode 22 is formed under a trench gate electrode 10 in an active trench 8. The shield electrode 22 is connected to an emitter electrode 14. The trench gate electrode 10 and the shield electrode 22 are insulated from each other by an insulating film. An upper end of the shield electrode 22 is lower than a lower end of a base layer 5. As a result, a parasitic capacitance of the trench gate electrode 10 can be reduced.

Fifth Embodiment

Figure 8:
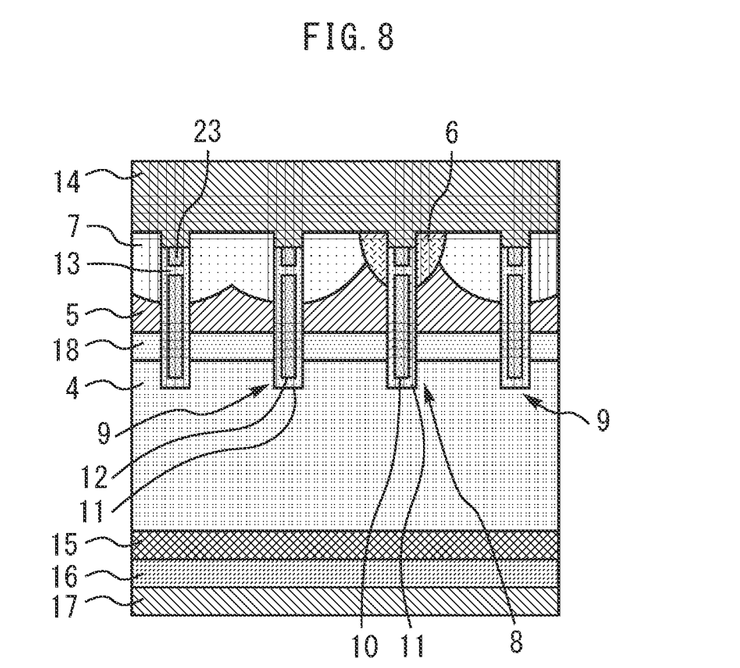
FIG. 8 is a cross-sectional view illustrating a semiconductor device according to a fifth embodiment.

FIG. 8 is a cross-sectional view illustrating a semiconductor device according to a fifth embodiment. Polysilicon 23 is formed on a trench gate electrode 10 with an embedded insulating film 13 interposed therebetween in an active trench 8. The polysilicon 23 is connected to an emitter electrode. An upper end of the polysilicon 23 is lower than an upper surface of a semiconductor substrate 1. Generally, an embedding characteristic of polysilicon is better than that of an insulating film. Accordingly, the embedding characteristic in an upper part of the active trench 8 can be improved.

Sixth Embodiment

Figure 9:
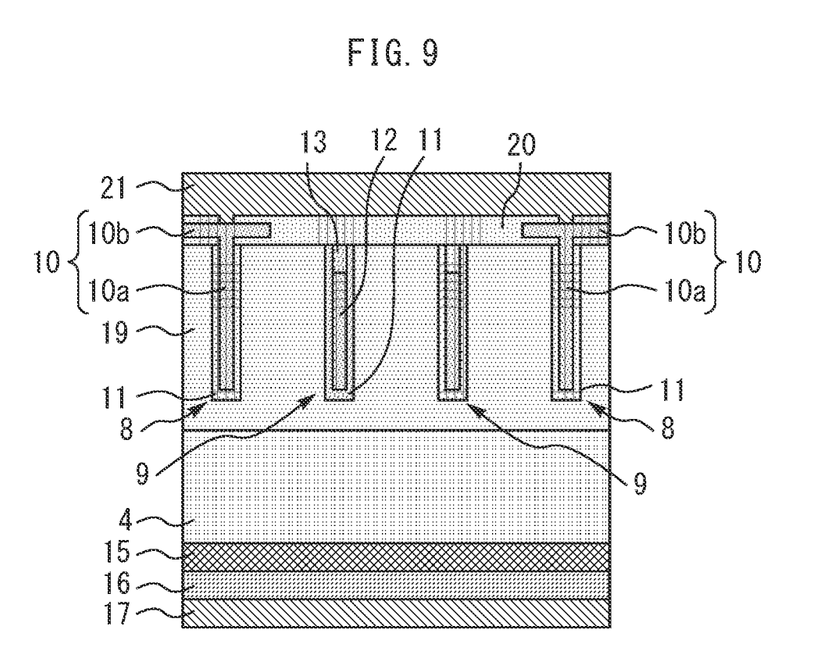
FIG. 9 is a cross-sectional view illustrating a semiconductor device according to a sixth embodiment.

FIG. 9 is a cross-sectional view illustrating a semiconductor device according to a sixth embodiment. In the present embodiment, a trench gate electrode 10 includes a first portion 10a in an active trench 8 and a second portion 10b protruding upward from an upper surface of a semiconductor substrate 1 in a part of a wiring region 3. The second portion 10b is connected to a gate electrode 21 via an opening of an interlayer insulating film 20. The width of the second portion 10b is larger than that of the first portion 10a. As a result, even when a position or a dimension of the opening of the interlayer insulating film 20 varies, the opening is easily formed in a range of the second portion 10b. Therefore, a possibility that the opening of the interlayer insulating film 20 shifts so that the gate electrode 21 and the semiconductor substrate 1 contact each other decreases. Accordingly, an insulating characteristic can be increased.

Seventh Embodiment

Figure 10:
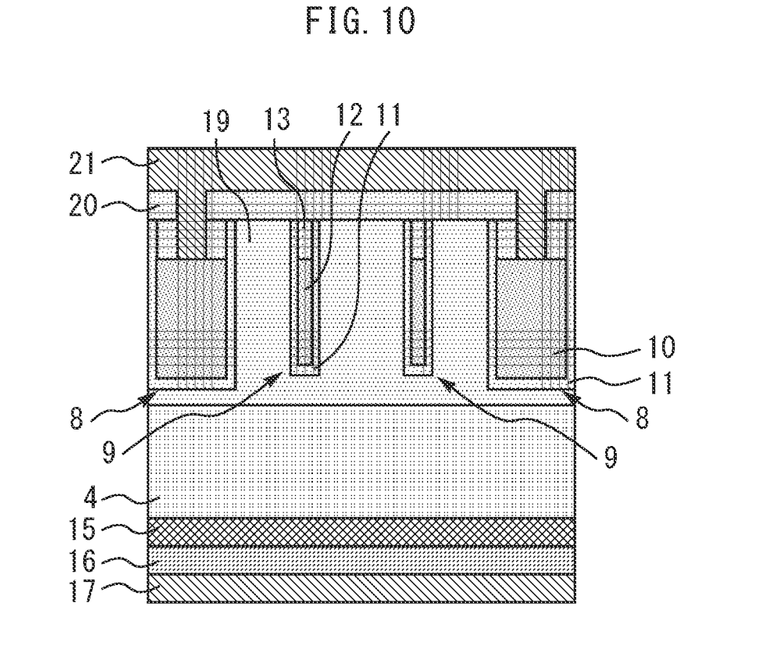
FIG. 10 is a cross-sectional view illustrating a semiconductor device according to a seventh embodiment.

FIG. 10 is a cross-sectional view illustrating a semiconductor device according to a seventh embodiment. In the present embodiment, the width of an active trench 8 in a wiring region 3 is larger than the width of the active trench 8 in an active region 2. In this region, a trench gate electrode 10 and a gate electrode 21 are connected to each other via an opening of an embedded insulating film 13. As a result, the opening of the embedded insulating film 13 can be increased. Accordingly, an embedding characteristic of the gate electrode 21 into the opening can be improved.

Eighth Embodiment

Figure 11:
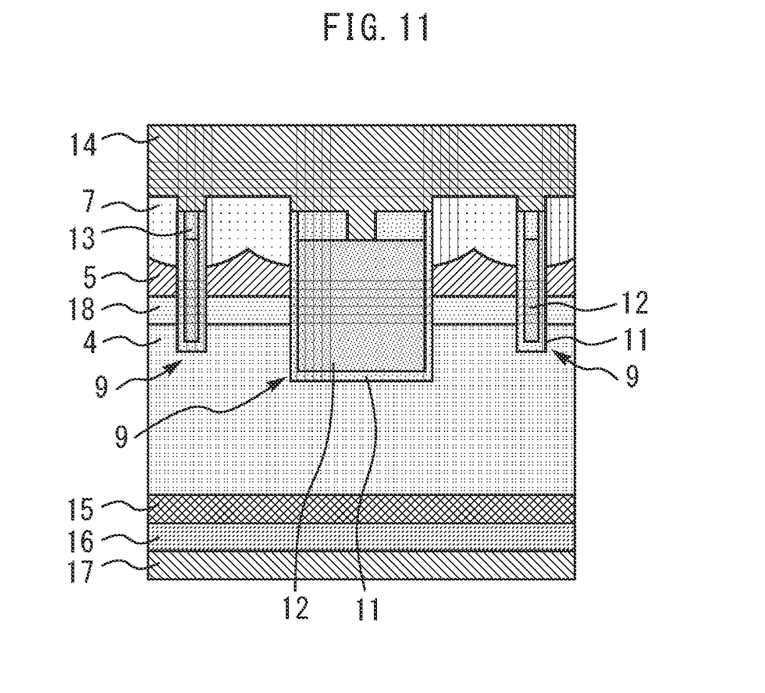
FIG. 11 is a cross-sectional view illustrating a semiconductor device according to an eighth embodiment.

FIG. 11 is a cross-sectional view illustrating a semiconductor device according to an eighth embodiment. In the present embodiment, the width of a dummy trench 9 is larger than that of an active trench 8 in a part of an active region 2. In the region, a dummy trench gate electrode 12 is connected to an emitter electrode 14 via an opening of an embedded insulating film 13. When the width of the dummy trench 9 is thus increased, an embedding characteristic of a metal between the dummy trench gate electrode 12 and the emitter electrode 14 can be improved.

A case where the semiconductor device is an insulated gate bipolar transistor (IGBT) has been described in the above-described embodiment. A configuration according to the present disclosure is not limited to this, but is applicable to a power device such as an MOSFET or an RC-IGBT. A withstand voltage class and an FZ substrate/MCZ substrate/epitaxial substrate, for example, are not limited. A combination of different embodiments is also possible, and a configuration according to the other embodiment can also be partially applied to a certain region.

The semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-041715, filed on Mar. 15, 2021 including specification, claims, drawings and summary, on which the convention priority of the present application is based, is incorporated herein by reference in its entirety.

The invention claimed is:

1. A semiconductor device comprising:
a semiconductor substrate including an upper surface and a lower surface opposing each other and a drift layer of a first conductivity type formed between the upper surface and the lower surface;
a base layer of a second conductivity type formed between the drift layer and the upper surface;
an emitter layer of the first conductivity type and a contact layer of the second conductivity type which are formed between the base layer and the upper surface;
an active trench penetrating the emitter layer and the base layer from the upper surface;
dummy trenches sandwiching the active trench and penetrating the contact layer and the base layer from the upper surface;
a trench gate electrode formed in the active trench with a gate insulating film interposed therebetween;
a dummy trench gate electrode formed in each of the dummy trenches with a gate insulating film interposed therebetween;
an embedded insulating film formed on the trench gate electrode in the active trench, formed on the dummy trench gate electrode in the dummy trench, and having an upper end lower than the upper surface; and
an emitter electrode contacting the emitter layer on the upper surface and an inner wall of the active trench, and contacting the contact layer on the upper surface and an inner wall of the dummy trench.

2. The semiconductor device according to claim 1, wherein a lower end of the contact layer is lower than a lower end of the emitter layer.

3. The semiconductor device according to claim 1, wherein in a region between the active trench and the dummy trench adjacent to each other, a width of the contact layer exposed to the upper surface is larger than a width of the emitter layer exposed to the upper surface.

4. The semiconductor device according to claim 1, wherein a width of the emitter layer narrows from the upper surface toward the lower surface.

5. The semiconductor device according to claim 1, further comprising a carrier storage layer of the first conductivity type formed between the drift layer and the base layer and having an impurity concentration higher than that of the drift layer.

6. The semiconductor device according to claim 1, wherein in a region between the dummy trenches adjacent to each other, an insulating film is formed between the upper surface and the emitter electrode.

7. The semiconductor device according to claim 1, wherein a width of the dummy trench is larger than a width of the active trench, and
a depth of the dummy trench is larger than a depth of the active trench.

8. The semiconductor device according to claim 1, further comprising a shield electrode formed under the trench gate electrode in the active trench and connected to the emitter electrode,
wherein an upper end of the shield electrode is lower than a lower end of the base layer.

9. The semiconductor device according to claim 1, further comprising polysilicon formed on the trench gate electrode in the active trench and connected to the emitter electrode,
wherein an upper end of the polysilicon is lower than the upper surface.

10. The semiconductor device according to claim 1, wherein the semiconductor substrate includes an active region and a wiring region in a planar view,
the emitter electrode is formed on the upper surface in the active region,
a gate electrode is formed on the upper surface with an interlayer insulating film interposed therebetween in the wiring region, and
the trench gate electrode is connected to the gate electrode via an opening of the interlayer insulating film.

11. The semiconductor device according to claim 10, wherein the trench gate electrode includes a first portion in an active trench and a second portion protruding upward from the upper surface in a part of the wiring region, connected to the gate electrode via the opening and having a width larger than that of the first portion.

12. The semiconductor device according to claim 10, wherein a width of the active trench in a part of the wiring region is larger than a width of the active trench in the active region.

13. The semiconductor device according to claim 10, wherein in a part of the active region, an upper end of the dummy trench gate electrode is exposed to the upper surface and is connected to the emitter electrode.

14. The semiconductor device according to claim 13, wherein in a part of the active region, a width of a dummy trench is larger than that of an active trench and the dummy trench gate electrode is connected to the emitter electrode via an opening of the embedded insulating film.

15. The semiconductor device according to claim 1, wherein the semiconductor substrate is made of a wide-band-gap semiconductor.

* * * * *